(12) United States Patent
Onitsuka et al.

(10) Patent No.: US 7,107,672 B2
(45) Date of Patent: Sep. 19, 2006

(54) METHOD OF MOUNTING ELECTRONIC PARTS ON A FLEXIBLE PRINTED CIRCUIT BOARD

(75) Inventors: Yasuto Onitsuka, Fukuoka (JP); Teruaki Nishinaka, Tosu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 433 days.

(21) Appl. No.: 10/635,314

(22) Filed: Aug. 6, 2003

(65) Prior Publication Data

US 2004/0027811 A1 Feb. 12, 2004

(30) Foreign Application Priority Data

Aug. 7, 2002 (JP) ............... P. 2002-229777

(51) Int. Cl.
*H05K 3/30* (2006.01)
(52) U.S. Cl. .............. 29/832; 29/281.5; 29/830; 29/739; 29/740; 29/760; 248/309.1; 248/309.2; 269/47; 269/52; 269/903
(58) Field of Classification Search .......... 29/281.5, 29/739, 740, 760, 830, 832, 831; 248/309.1, 248/309.2; 269/903, 47, 52
See application file for complete search history.

(56) References Cited

U.S. PATENT DOCUMENTS

| 4,593,804 | A | | 6/1986 | Kisney et al. |
| 5,566,840 | A | * | 10/1996 | Waldner et al. .......... 211/41.17 |
| 6,183,190 | B1 | * | 2/2001 | Raiteri .................... 414/788.7 |
| 6,378,857 | B1 | * | 4/2002 | Taylor ......................... 269/47 |

FOREIGN PATENT DOCUMENTS

| FR | 2 741 505 | 5/1997 |
| JP | 8264996 | 10/1996 |

* cited by examiner

Primary Examiner—Richard Chang
(74) Attorney, Agent, or Firm—Pearne & Gordon LLP

(57) ABSTRACT

A plurality of flexible printed circuit boards are held on a transfer carrier, which is formed by a base plate and a resin layer formed on an upper surface of the base plate. Reference pins are positioned at reference pin openings of the carrier base plate and reference holes of the flexible printed circuit boards are positioned at the reference pins in order to adhere the board to the carrier resin layer. Electronic parts are mounted on the flexible printed circuit board by bonding the electronic parts to bonding portions of the flexible printed circuit board.

4 Claims, 15 Drawing Sheets

METHOD OF MOUNTING ELECTRONIC PARTS ON A FLEXIBLE PRINTED CIRCUIT BOARD

BACKGROUND OF THE INVENTION

1. Field of the Invention

The present invention relates to a transfer carrier for a flexible printed circuit board for holding and transferring flexible printed circuit boards on each of which a semiconductor device and small parts are mounted, and also relates to an electronic parts mounting method on a flexible printed circuit board.

2. Description of Related Art

Since a film-shaped thin circuit board such as a flexible printed circuit board on which electronic parts are mounted is hard to be treated by itself, the film-shaped thin circuit boards are usually treated in a state that a plurality of the flexible printed circuit boards are held on a plate-shaped transfer carrier. Electronic parts are also mounted on such the flexible printed circuit boards in a state that the flexible printed circuit boards are held on the transfer carrier. Thus, the transfer carrier used in an electronic parts mounting process is required to have a positioning function for holding the flexible printed circuit boards with preferable positioning accuracy.

The electronic parts to be mounted on the flexible printed circuit board are not limited to ones of the same mounting method but there is a case that the electronic parts are mounted on the same flexible printed circuit board with different mounting methods. For example, there is a case that small parts such as resistors and capacitors to be mounted through the reflow soldering are mounted on the same flexible printed circuit board together with a semiconductor device such as a flip chip to be mounted through the bonding method. The transfer carrier for holding such a type of the flexible printed circuit board is desirably provided with heat resisting property so as to be usable in the reflow process together with the aforesaid positioning function.

However, conventionally, it is difficult to realize such a transfer carrier provided with both the preferable positioning function and heat resisting property, and hence the transfer carriers dedicated for the respective mounting methods are required. That is, it is required to perform such a procedure that the flexible printed circuit boards on which the semiconductor devices were bonded are removed from a transfer carrier for bonding and the flexible printed circuit boards are transferred on another transfer carrier for soldering. Thus, it is necessary to prepare plural kinds of the transfer carriers for respective kinds of the flexible printed circuit boards. As a result, there arises a problem that the cost of the equipment increases, and it is troublesome to transfer the flexible printed circuit boards on the way of the mounting process to another transfer carrier and so the manufacturing efficiency is degraded.

SUMMARY OF THE INVENTION

Accordingly, an object of the invention is to provide a transfer carrier for a flexible printed circuit board and an electronic parts mounting method on a flexible printed circuit board which can cope with different mounting methods by using the same transfer carrier.

A transfer carrier for a flexible printed circuit board according to claim 1 is arranged in a manner that, in the transfer carrier for a flexible printed circuit board which holds a plurality of flexible printed circuit boards in a state of being adhered on an upper surface of the transfer carrier, each of the flexible printed circuit boards being formed with a positioning reference hole and a bonding portion on which a semiconductor device is bonded, the transfer carrier comprising:

a base plate on which a resin layer with a smooth surface to be adhered with lower surfaces of the flexible printed circuit boards is formed;

back-up opening portions opened respectively at portions of the base plate corresponding to the bonding portions, and through each of the back-up opening portions a back-up portion for receiving a pressing force at a time of bonding the semiconductor device penetrating;

reference pin opening portions opened at the base plate and through which reference pins penetrate respectively, the reference pins being inserted into the reference holes of the flexible printed circuit boards to position the bonding portions of the flexible printed circuit boards with respect to the back-up opening portions, respectively; and reference portions formed at the base plate, the reference portions respectively contacting with reference members for relatively positioning the reference pin opening portions and the reference pins.

A transfer carrier for a flexible printed circuit board according to claim 2 is arranged in a manner that in the transfer carrier for a flexible printed circuit board according to claim 1, the resin layer is formed by resin of silicon group.

A transfer carrier for a flexible printed circuit board according to claim 3 is arranged in a manner that in the transfer carrier for a flexible printed circuit board according to claim 1, the resin layer is formed by hardening liquid resin on the base plate.

A transfer carrier for a flexible printed circuit board according to claim 4 is arranged in a manner that in the transfer carrier for a flexible printed circuit board according to claim 1, the resin layer is electrically conductive.

A transfer carrier for a flexible printed circuit board according to claim 5 is arranged in a manner that in the transfer carrier for a flexible printed circuit board according to claim 1, each of the reference members at least includes a positioning pin and each of the reference portions is a positioning hole for receiving a corresponding one of the positioning pins therethrough.

A transfer carrier for a flexible printed circuit board according to claim 6 is arranged in a manner that in the transfer carrier for a flexible printed circuit board according to claim 1, each of the reference members includes a positioning reference surface which contacts with a side surface of the base plate, and the side surface is the reference portions.

A transfer carrier for a flexible printed circuit board according to claim 7 is arranged in a manner that in the transfer carrier for a flexible printed circuit board which holds a plurality of flexible printed circuit boards in a state of being adhered on an upper surface of the transfer carrier, each of the flexible printed circuit boards being formed with a positioning reference hole and a bonding portion on which a semiconductor device is bonded, the transfer carrier including:

a base plate on which a resin layer with a smooth surface to be adhered with lower surfaces of the flexible printed circuit boards is formed;

opening portions opened respectively at portions of the base plate corresponding to the bonding portions, through each of the opening portions a back-up portion for receiving a pressing force at a time of bonding the semiconductor device penetrating, and through each of the opening portions a reference pin being inserted into the reference hole of corresponding one of the flexible printed circuit boards to position the bonding portion of the corresponding one of the flexible printed circuit boards; and reference portions formed at the base plate, the reference portions respectively contacting with reference members for relatively positioning the reference pin opening portions and the reference pins.

A transfer carrier for a flexible printed circuit board according to claim 8 is arranged in a manner that in the transfer carrier for a flexible printed circuit board according to claim 7, the resin layer is formed by resin of silicon group.

A transfer carrier for a flexible printed circuit board according to claim 9 is arranged in a manner that in the transfer carrier for a flexible printed circuit board according to claim 7, the resin layer is formed by hardening liquid resin on the base plate.

A transfer carrier for a flexible printed circuit board according to claim 10 is arranged in a manner that in the transfer carrier for a flexible printed circuit board according to claim 7, the resin layer is electrically conductive.

A transfer carrier for a flexible printed circuit board according to claim 11 is arranged in a manner that in the transfer carrier for a flexible printed circuit board according to claim 7, each of the reference members at least includes a positioning pin and each of the reference portions is a positioning hole for receiving a corresponding one of the positioning pins therethrough.

A transfer carrier for a flexible printed circuit board according to claim 12 is arranged in a manner that in the transfer carrier for a flexible printed circuit board according to claim 7, each of the reference members includes a positioning reference surface which contacts with a side surface of the base plate, and the side surface is the reference portions.

A method of mounting electronic parts on a flexible printed circuit board according to claim 13 is arranged in a manner that in the method of mounting electronic parts on a flexible printed circuit board in which a plurality of flexible printed circuit boards are held on a transfer carrier for the flexible printed circuit boards which is formed by a base plate and a resin layer formed on an upper surface of the base plate, and semiconductor devices are bonded on bonding portions of the flexible printed circuit boards, the method including:

a step of contacting reference portions of the base plate with reference members thereby to relatively position reference pin opening portions opened at the base plate and reference pins to be respectively inserted into reference holes of the flexible printed circuit boards in a state where the reference pins are respectively penetrated through the reference pin opening portions;

a step of inserting the reference pins into the reference holes of the flexible printed circuit boards to position the flexible printed circuit boards, respectively, and contacting adhesively lower surfaces of the flexible printed circuit boards to the resin layer in this state;

a step of withdrawing the reference pins from the reference holes and releasing the contact state between the reference portions and the reference members;

a step of inserting a back-up portion of a bonding apparatus into a back-up opening potion which is formed at a position of the transfer carrier corresponding to the bonding portion of the flexible printed circuit board thereby to support the bonding portion from a lower direction; and a step of bonding a semiconductor device on the bonding portion supported by the back-up portion.

A method of mounting electronic parts on a flexible printed circuit board according to claim 14 is arranged in a manner that in the method of mounting electronic parts on a flexible printed circuit board in which a plurality of flexible printed circuit boards are held on a transfer carrier for the flexible printed circuit boards which is formed by a base plate and a resin layer formed on an upper surface of the base plate, semiconductor devices are bonded on bonding portions of the flexible printed circuit boards, and small parts are soldered on solder coupling portions, the method including:

a step of contacting reference portions of the base plate with reference members thereby to relatively position reference pin opening portions opened at the base plate and reference pins to be respectively inserted into reference holes of the flexible printed circuit boards in a state where the reference pins are respectively penetrated through the reference pin opening portions;

a step of inserting the reference pins into the reference holes of the flexible printed circuit boards to position the flexible printed circuit boards, respectively, and contacting adhesively lower surfaces of the flexible printed circuit boards to the resin layer in this state;

a step of withdrawing the reference pins from the reference holes and releasing the contact state between the reference portions and the reference members;

a step of inserting a back-up portion of a bonding apparatus into a back-up opening potion which is formed at a position of the transfer carrier corresponding to the bonding portion of the flexible printed circuit board thereby to support the bonding portion from a lower direction;

a step of bonding a semiconductor device on the bonding portion supported by the back-up portion;

a step of supplying solder to electrodes of the solder coupling portions of the flexible printed circuit boards on which the semiconductor devices are bonded;

a step of contacting the small parts to the solder thereby to mount the small parts on the flexible printed circuit boards on which the semiconductor devices are bonded;

a step of transferring into a heating furnace and heating a transfer carrier for the flexible printed circuit boards which holds the flexible printed circuit boards on which the small parts are mounted thereby to melt the solder to solder the small parts; and a step of taking out the flexible printed circuit boards on which the semiconductor devices are bonded and the small parts are soldered from the resin layer of the transfer carrier.

A method of mounting electronic parts on a flexible printed circuit board according to claim 15 is arranged in a manner that in the method of mounting electronic parts on a flexible printed circuit board in which a plurality of flexible printed circuit boards are held on a transfer carrier for the flexible printed circuit boards which is formed by a base plate and a resin layer formed on an upper surface of the base plate, and semiconductor devices are bonded on bonding portions of the flexible printed circuit boards, the method including:

a step of contacting reference portions of the base plate with reference members thereby to relatively position reference pin opening portions opened at the base plate and reference pins to be respectively inserted into reference holes of the flexible printed circuit boards in a state where the reference pins are respectively penetrated through the reference pin opening portions;

a step of inserting the reference pins into the reference holes of the flexible printed circuit boards to position the flexible printed circuit boards, respectively, and contacting adhesively lower surfaces of the flexible printed circuit boards to the resin layer in this state;

a step of withdrawing the reference pins from the reference holes and releasing the contact state between the reference portions and the reference members;

a step of inserting a back-up portion of a bonding apparatus at a position of the opening portions corresponding to the bonding portion of the flexible printed circuit board thereby to support the bonding portion from a lower direction; and a step of bonding a semiconductor device on the bonding portion supported by the back-up portion.

A method of mounting electronic parts on a flexible printed circuit board according to claim 16 is arranged in a manner that in the method of mounting electronic parts on a flexible printed circuit board in which a plurality of flexible printed circuit boards are held on a transfer carrier for the flexible printed circuit boards which is formed by a base plate and a resin layer formed on an upper surface of the base plate, semiconductor devices are bonded on bonding portions of the flexible printed circuit boards, and small parts are soldered on solder coupling portions, the method including:

a step of contacting reference portions of the base plate with reference members thereby to relatively position opening portions opened at the base plate and reference pins to be respectively inserted into reference holes of the flexible printed circuit boards in a state where the reference pins are respectively penetrated through the opening portions;

a step of inserting the reference pins into the reference holes of the flexible printed circuit boards to position the flexible printed circuit boards, respectively, and contacting adhesively lower surfaces of the flexible printed circuit boards to the resin layer in this state;

a step of withdrawing the reference pins from the reference holes and releasing the contact state between the reference portions and the reference members;

a step of inserting a back-up portion of a bonding apparatus at a position of the opening portions corresponding to the bonding portion of the flexible printed circuit board thereby to support the bonding portion from a lower direction;

a step of bonding a semiconductor device on the bonding portion supported by the back-up portion;

a step of supplying solder to electrodes of the solder coupling portions of the flexible printed circuit boards on which the semiconductor devices are bonded;

a step of contacting the small parts to the solder thereby to mount the small parts on the flexible printed circuit boards on which the semiconductor devices are bonded;

a step of transferring into a heating furnace and heating a transfer carrier for the flexible printed circuit boards which holds the flexible printed circuit boards on which the small parts are mounted thereby to melt the solder to solder the small parts; and a step of taking out the flexible printed circuit boards on which the semiconductor devices are bonded and the small parts are soldered from the resin layer of the transfer carrier.

According to the invention, opening portions through which the back-up portions for bonding the semiconductor devices and the reference pins for positioning the flexible printed circuit board are passed are provided at the base plate on which a resin layer having a smooth surface to be adhered to the lower surface of the flexible printed circuit board is formed. Further, the reference portions to which the reference members for relatively positioning the opening portions and the reference pins contact are provided at the base plate. Thus, the flexible printed circuit boards can be held adhesively on the carrier in a state that the boards are positioned, whereby the same transfer carrier can cope with the different mounting methods.

BRIEF DESCRIPTION OF THE DRAWINGS

FIG. 9(*b*) is a diagram for explaining the bonding operation of electronic parts on the flexible printed circuit board according to the embodiment of the invention.

DETAILED DESCRIPTION OF THE PREFERRED EMBODIMENTS

Figure 1:
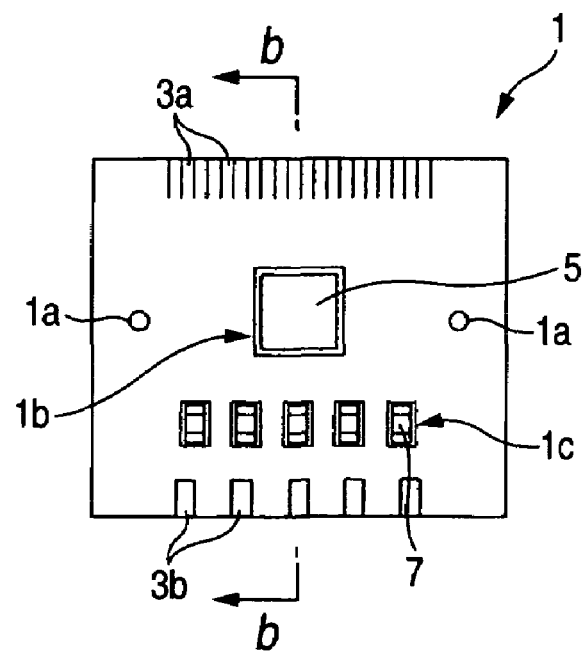
FIGS. 1(*a*)–1(*b*) is diagrams showing the configuration of a flexible printed circuit board having been mounted according to an embodiment of the invention.
Figure 1:
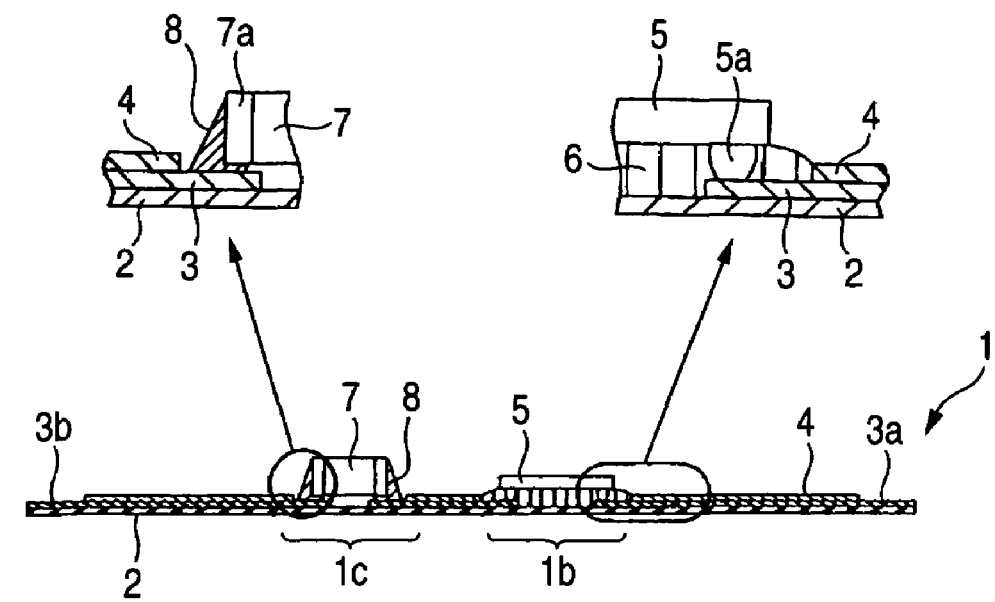
Figure 2:
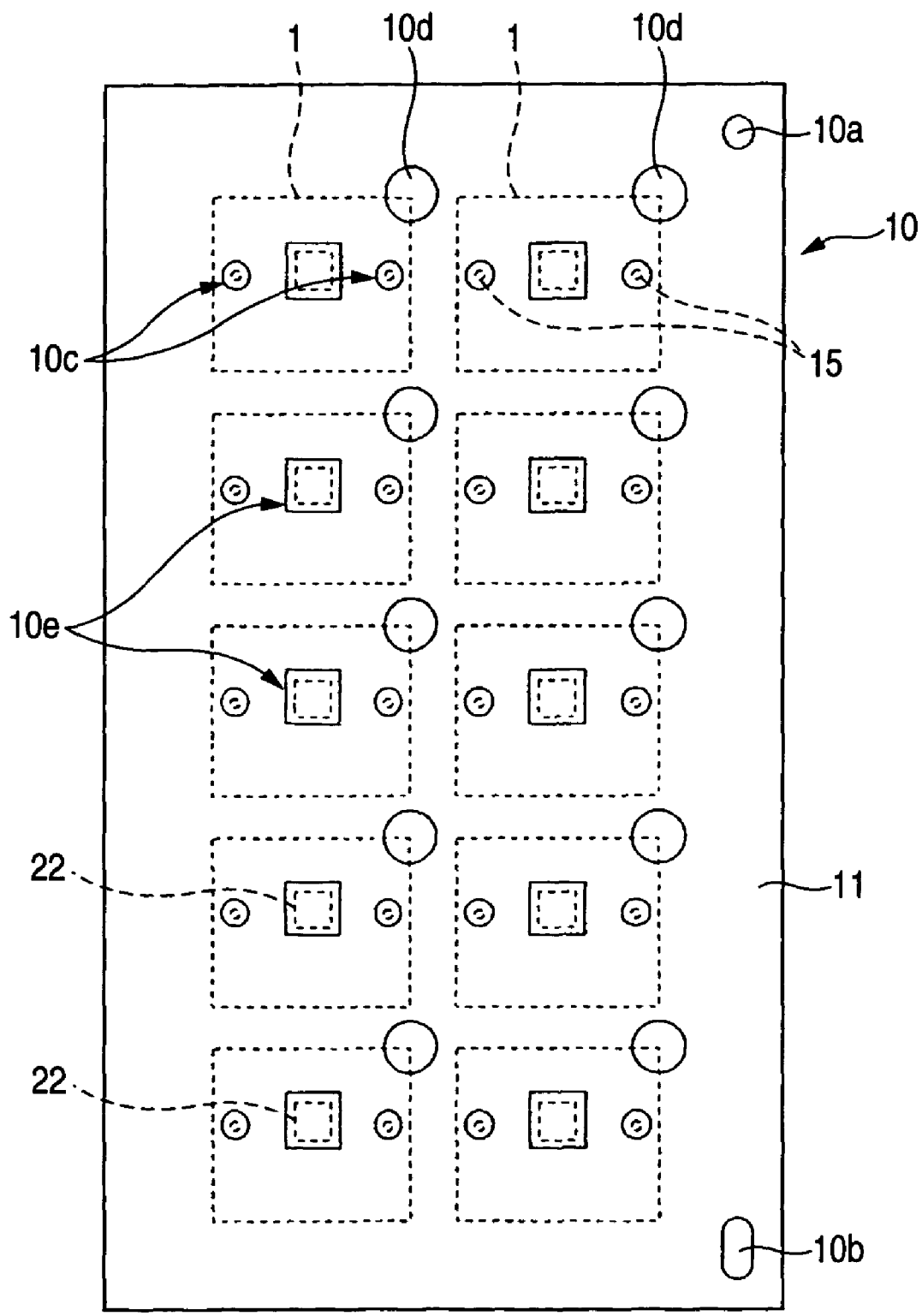
FIG. 2 is a plan view of the transfer carrier of the flexible printed circuit board according to the embodiment of the invention.
Figure 3:
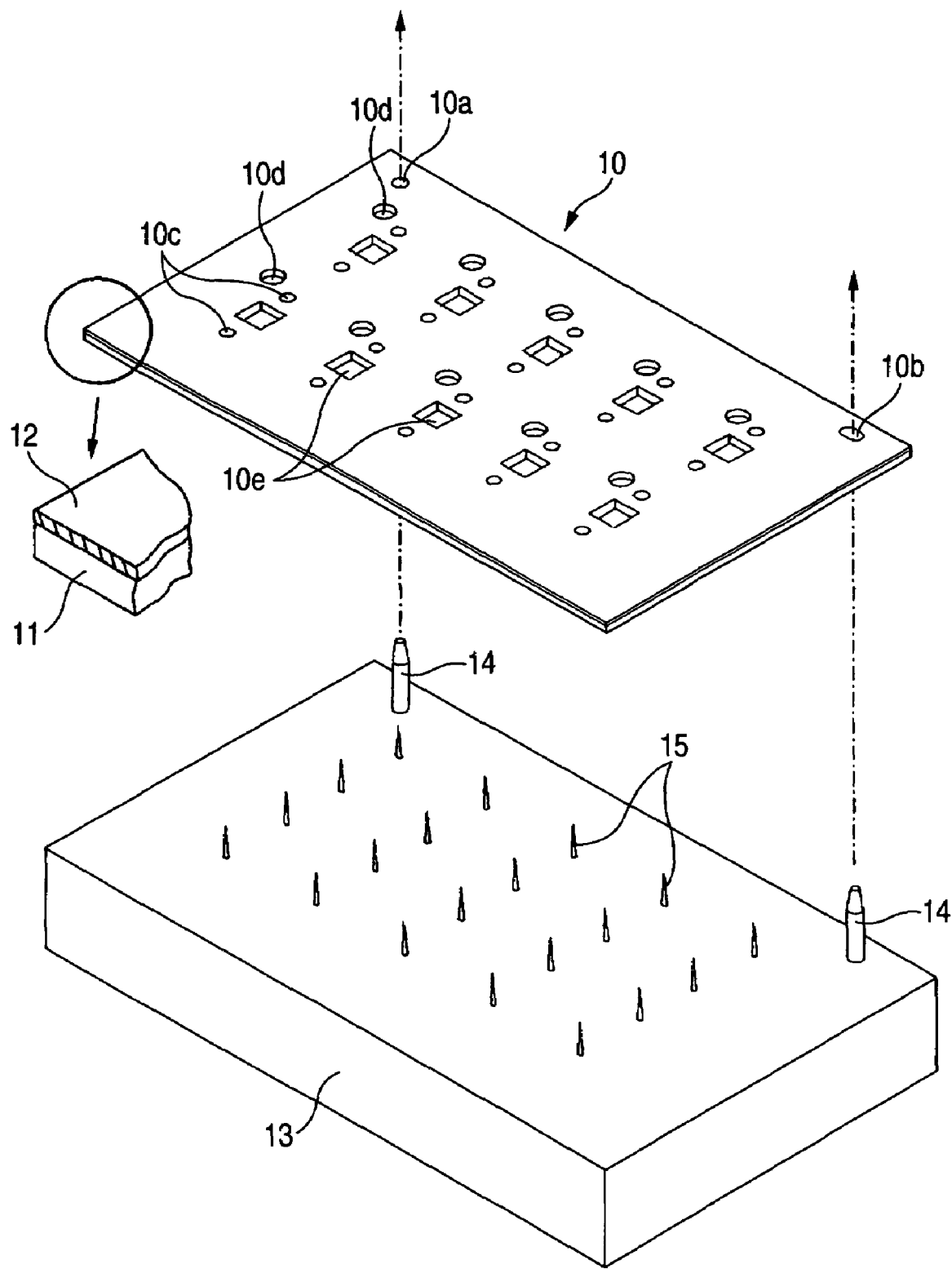
FIG. 3 is a perspective view showing the attachment jig and the transfer carrier of the flexible printed circuit board according to the embodiment of the invention.
Figure 4:
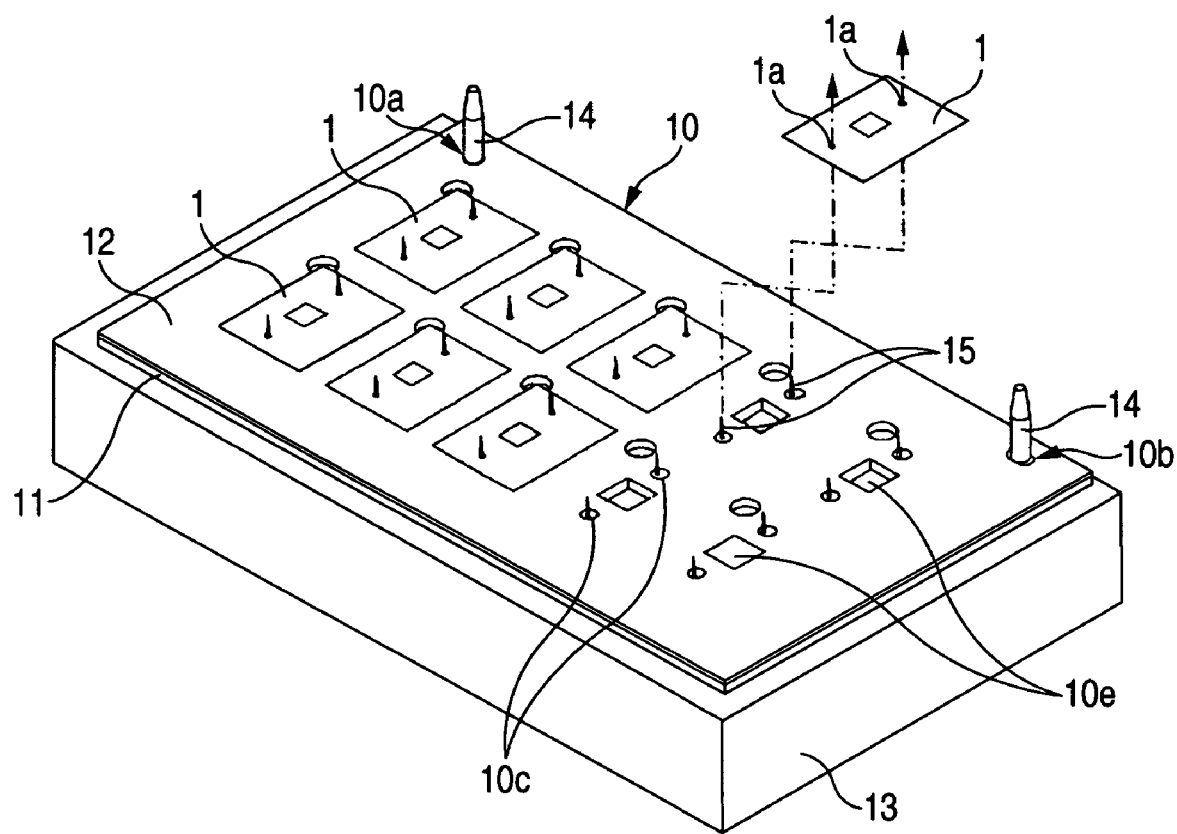
FIG. 4 is a diagram for explaining the attachment method of the flexible printed circuit board according to the embodiment of the invention.
Figure 5:
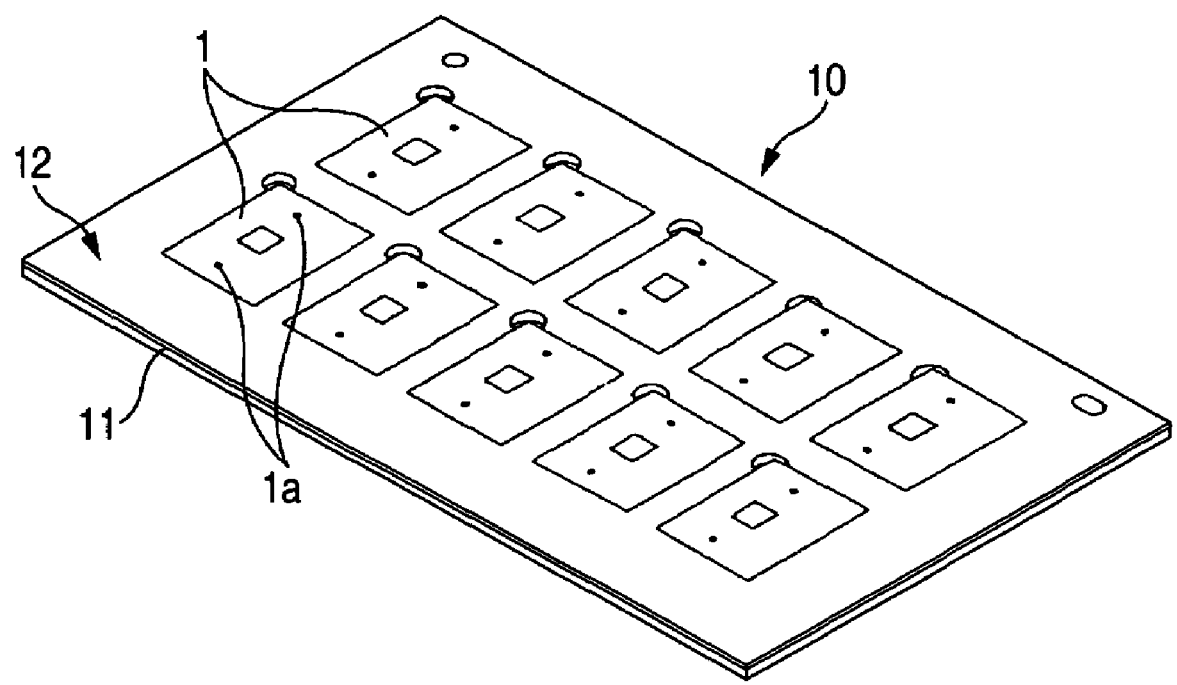
FIG. 5 is a perspective view showing the transfer carrier of the flexible printed circuit board according to the embodiment of the invention.
Figure 6:
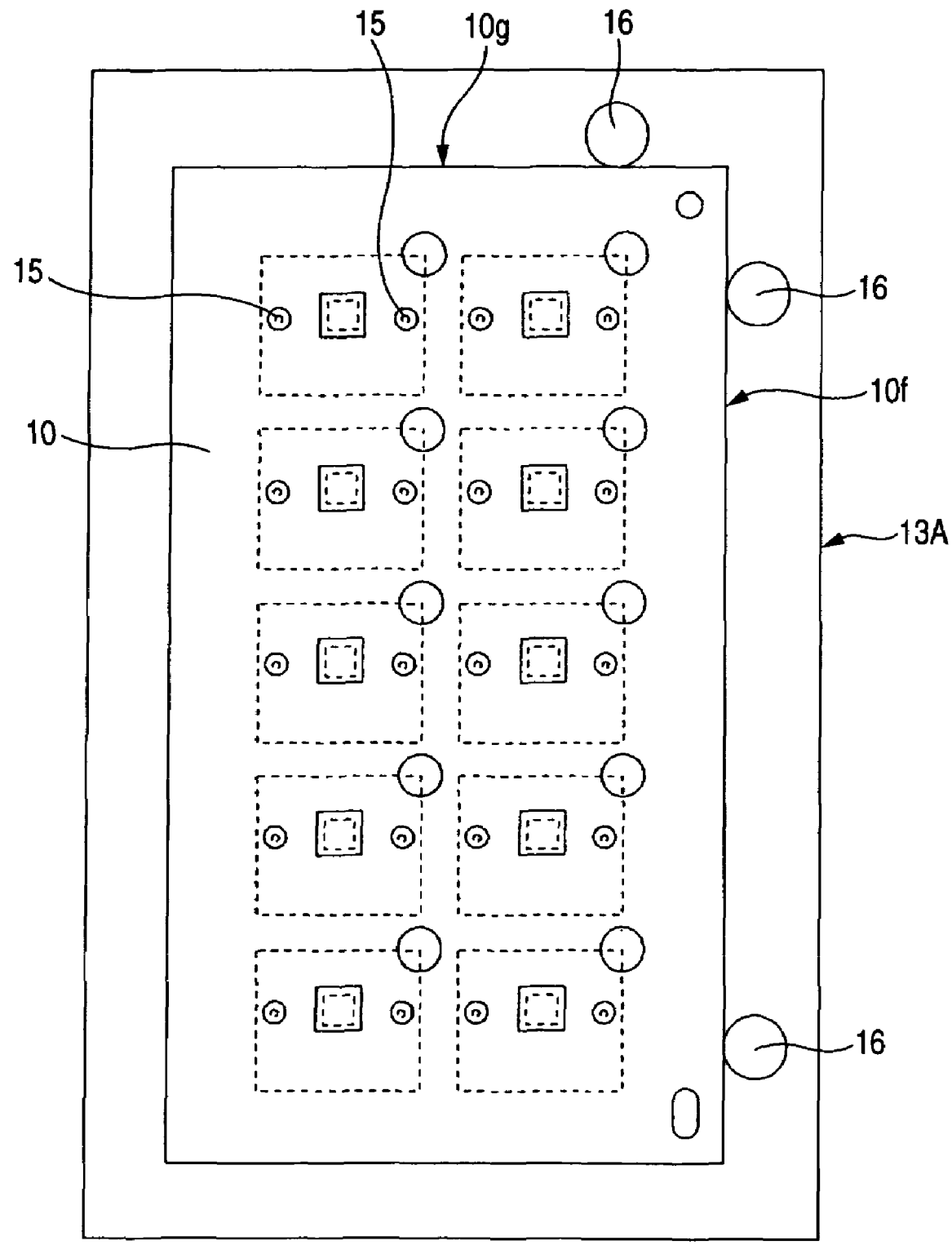
FIG. 6 is a plane view showing the attachment jig of the flexible printed circuit board according to the embodiment of the invention.
Figure 8:
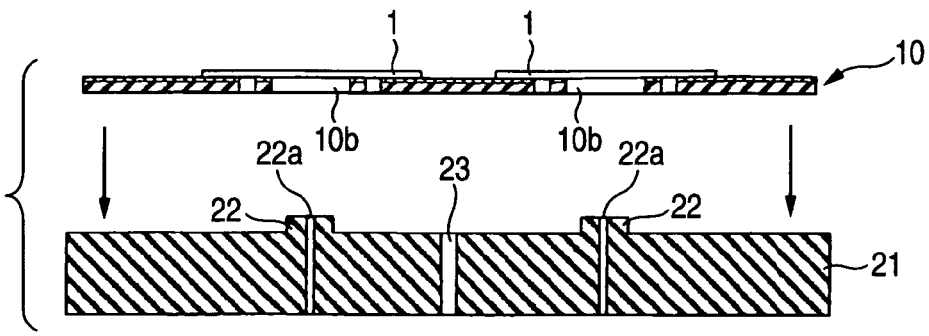
FIGS. 8(*a*)–8(*d*) is diagrams for explaining the process of an adhesive supplying operation for the flexible printed circuit board according to the embodiment of the invention.
Figure 8:
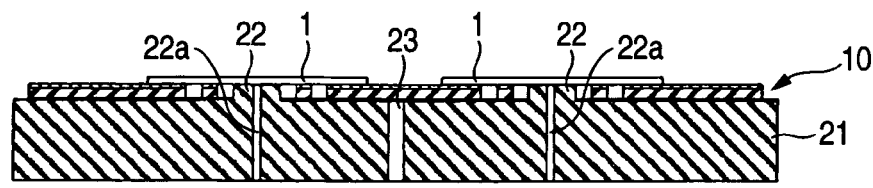
Figure 8:
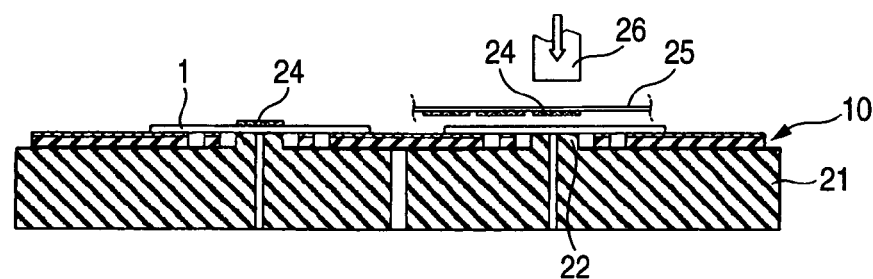
Figure 8:
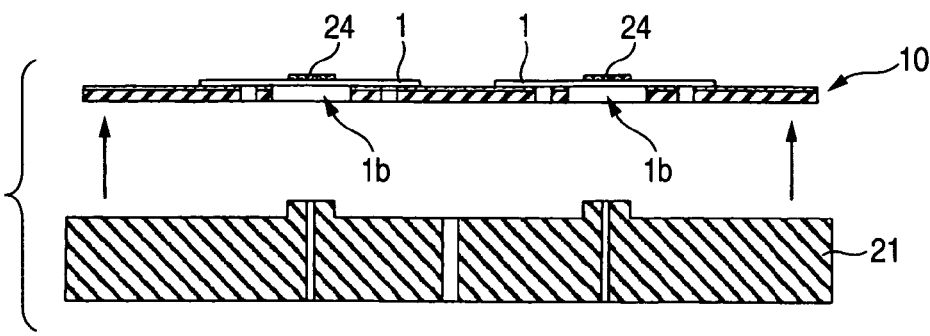
Figure 9:
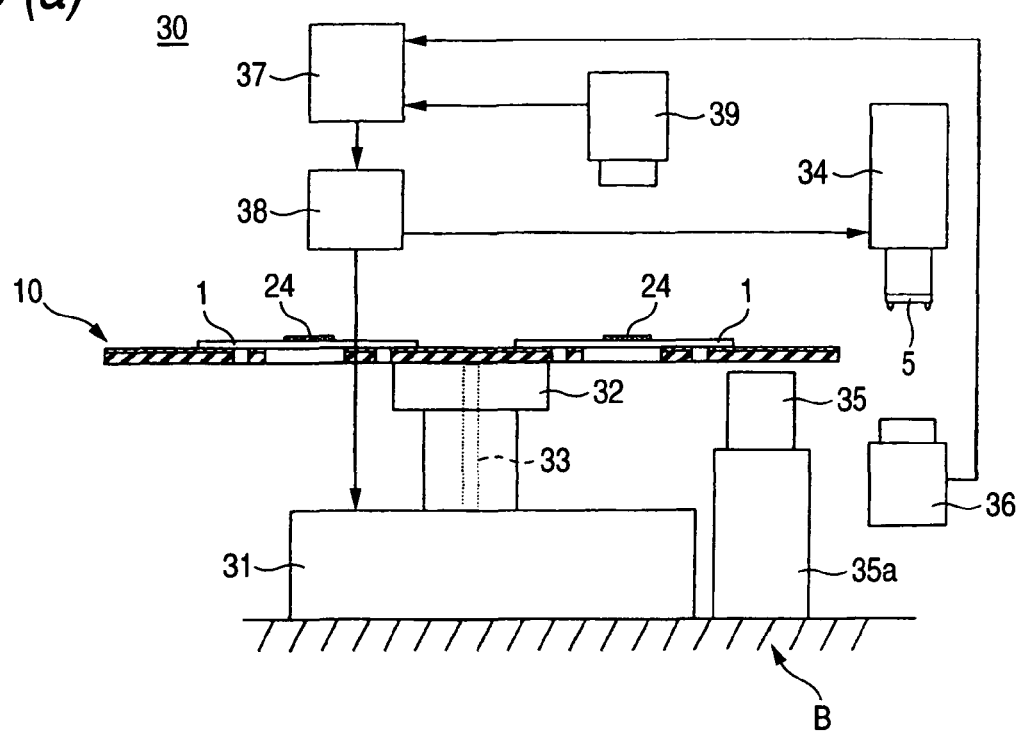
FIG. 9(*a*) is a sectional diagram showing an electronic part bonding apparatus for the flexible printed circuit board according to the embodiment of the invention.
Figure 9:
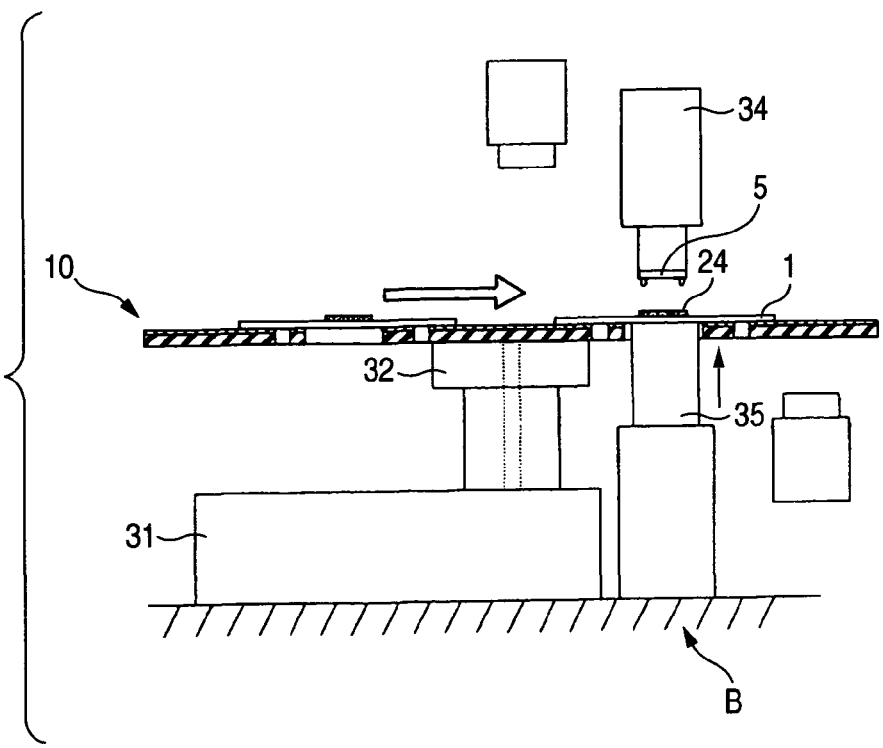
Figure 10:
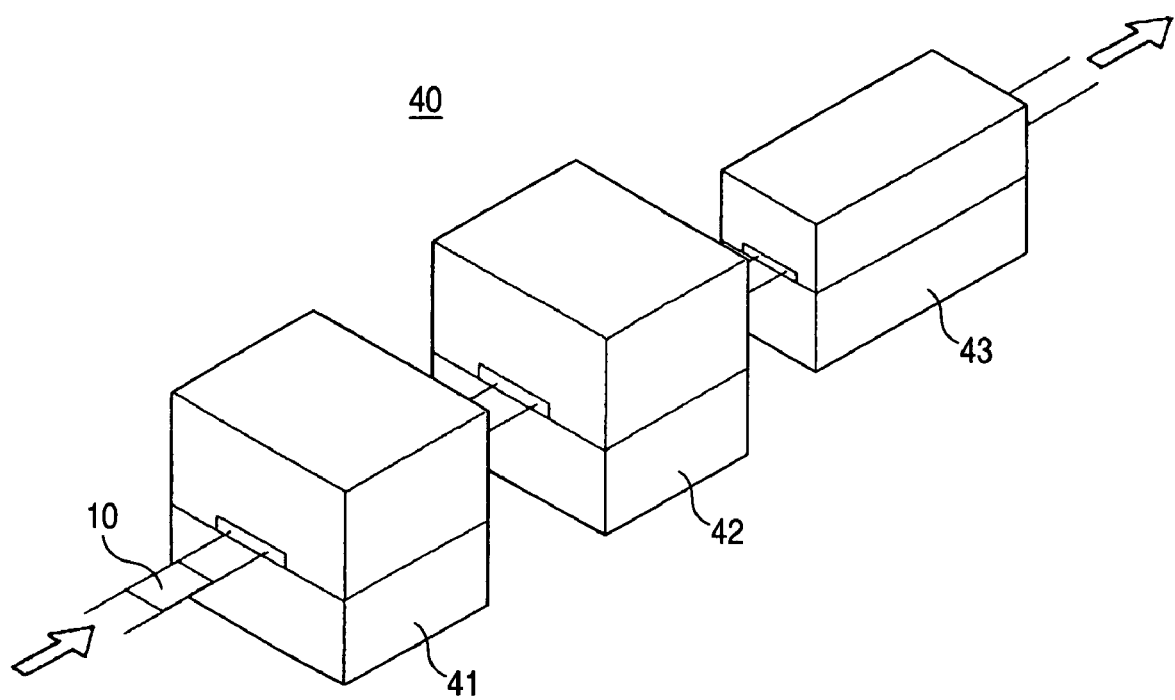
FIG. 10 is a diagram showing the configuration of the soldering line for the flexible printed circuit board according to the embodiment of the invention.
Figure 11:
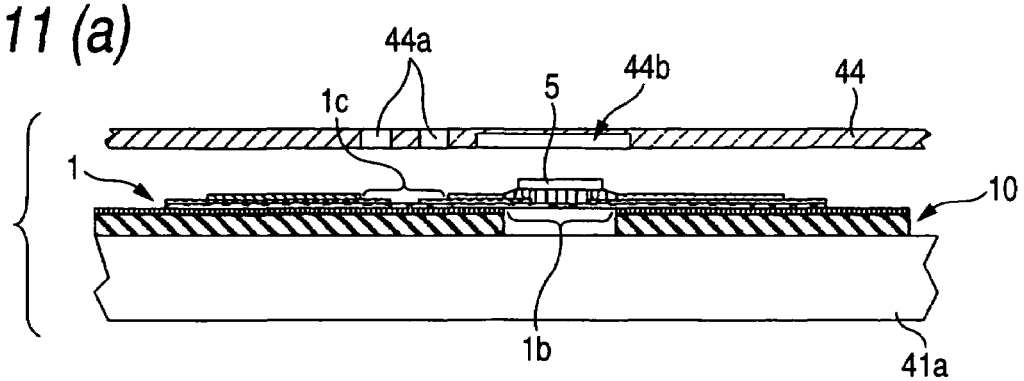
FIGS. 11(*a*)–11(*c*) is diagrams for explaining the process of a solder printing operation for the flexible printed circuit board according to the embodiment of the invention.
Figure 11:
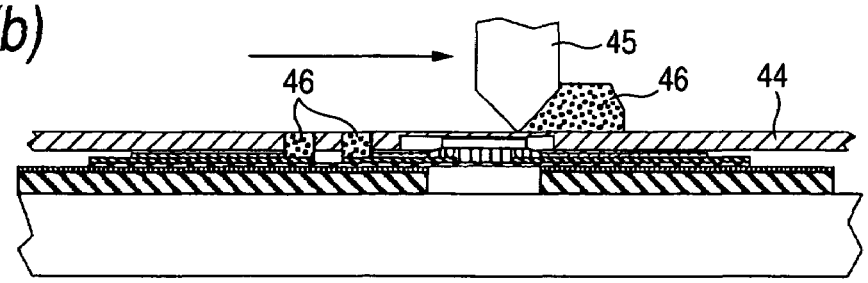
Figure 11:
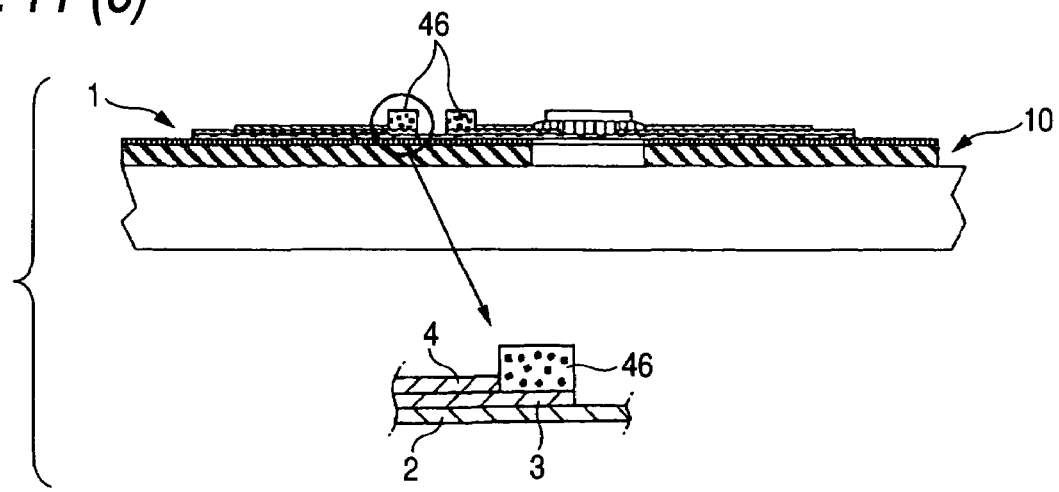
Figure 12:
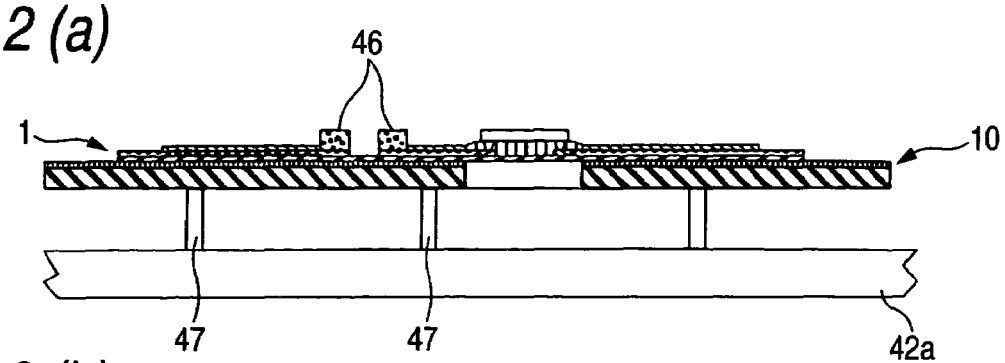
FIGS. 12(*a*)–12(*c*) is diagrams for explaining the process of an electronic part mounting operation for the flexible printed circuit board according to the embodiment of the invention.
Figure 12:
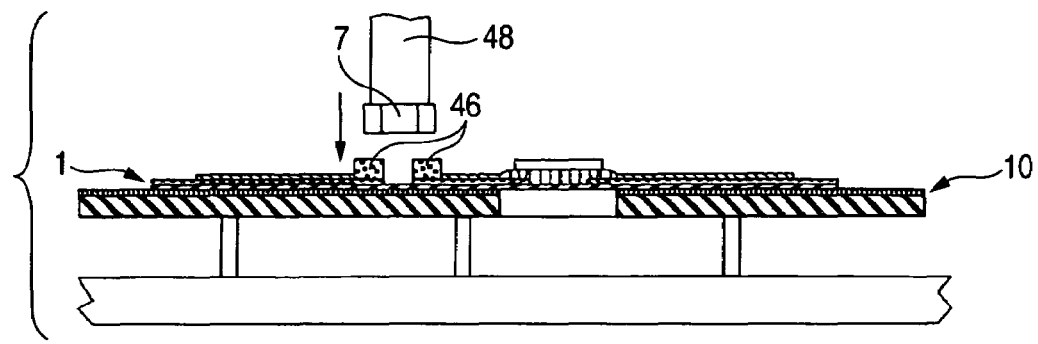
Figure 12:
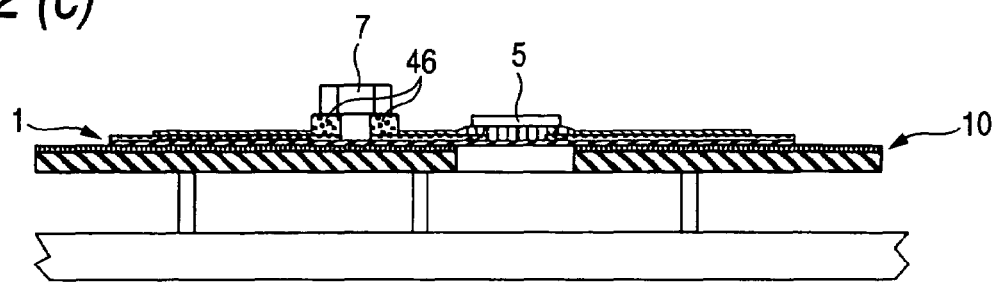
Figure 13:
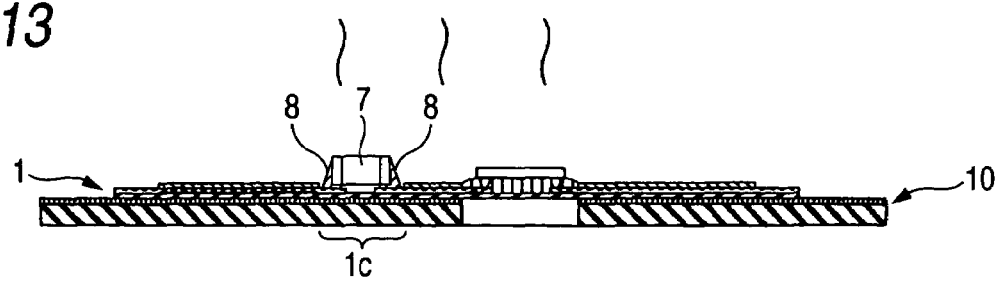
FIG. 13 is a sectional diagram showing the flexible printed circuit board after reflow soldering according to the embodiment of the invention.
Figure 14:
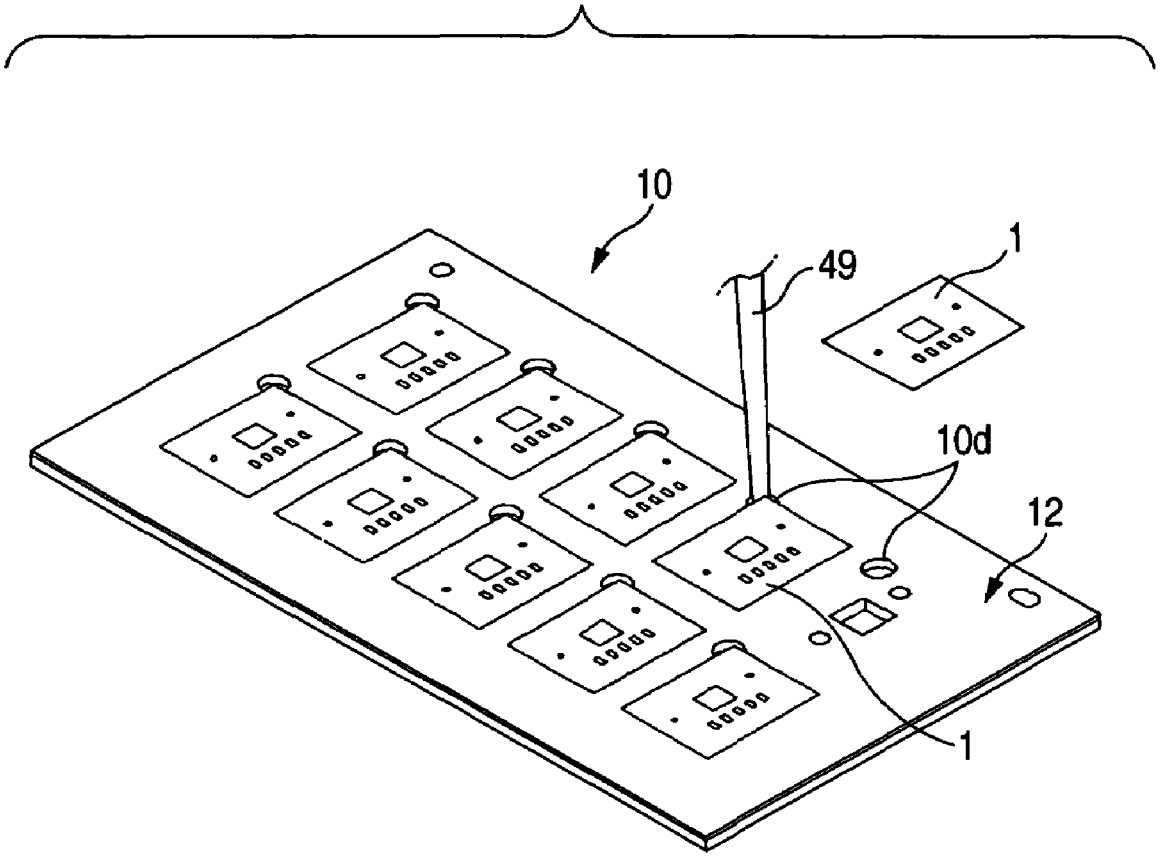
FIG. 14 is a perspective view showing the transfer carrier for the flexible printed circuit board according to the embodiment of the invention.
Figure 15:
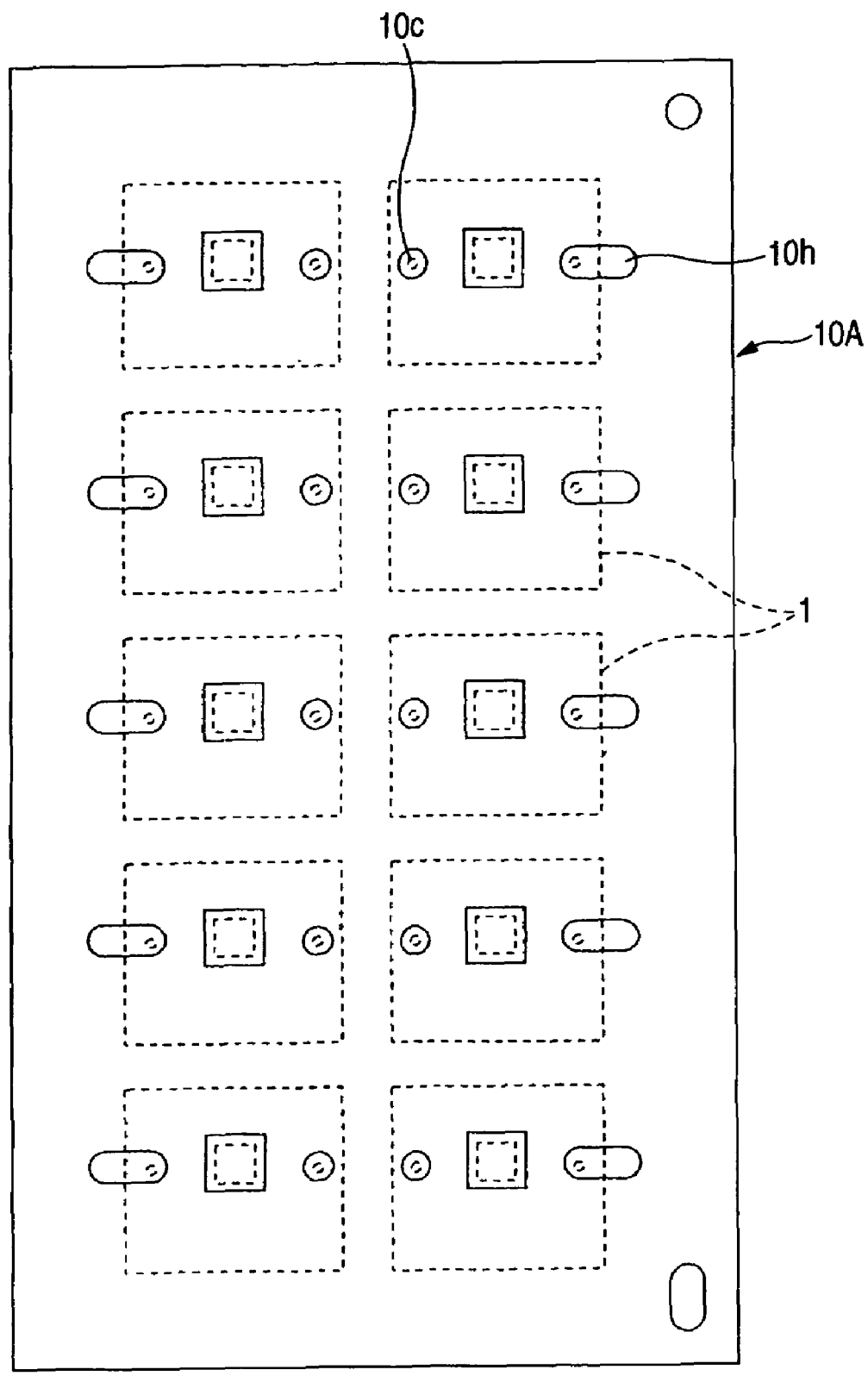
FIG. 15 is a plan view showing the transfer carrier for the flexible printed circuit board according to the embodiment of the invention.
Figure 16:
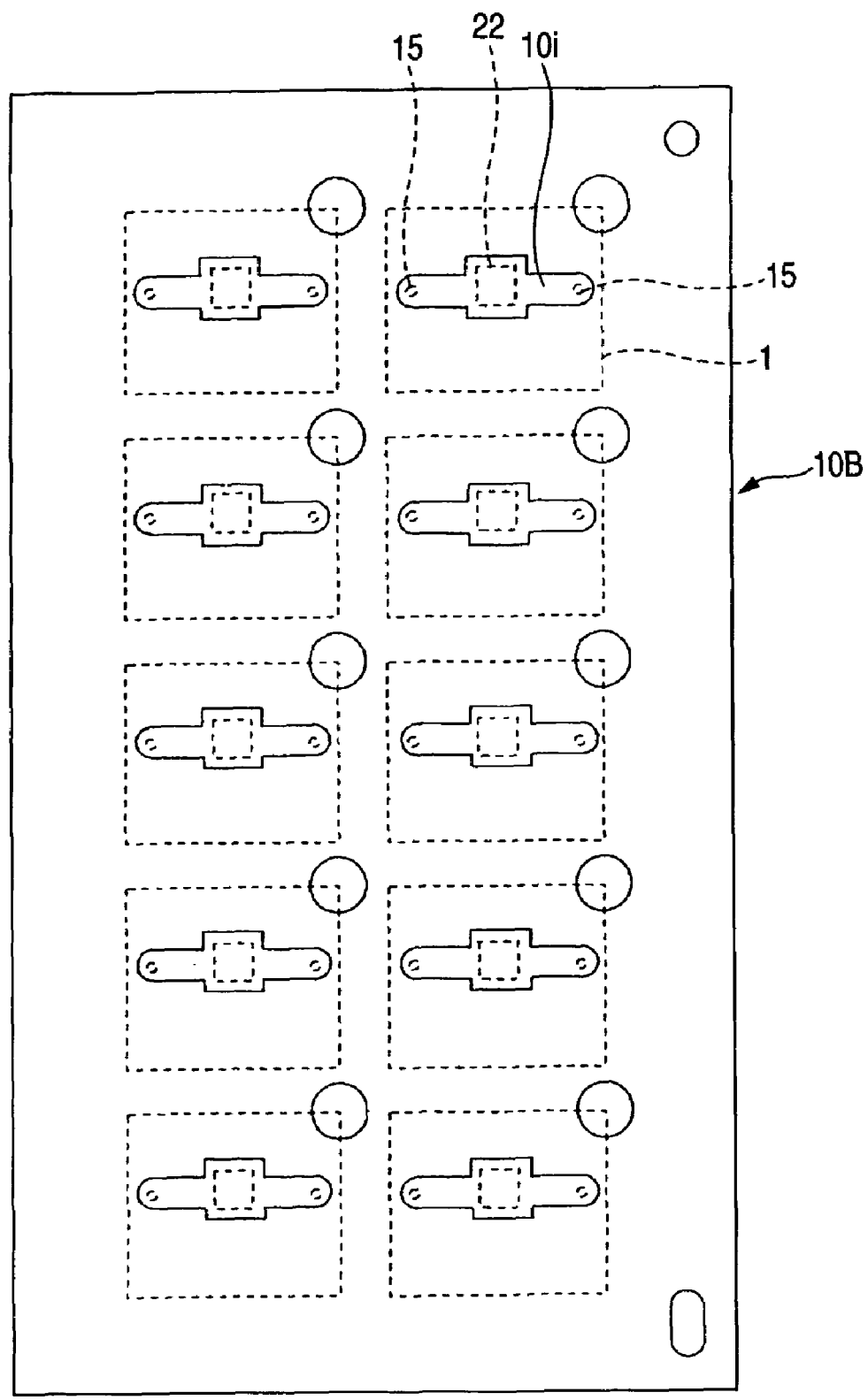
FIG. 16 is a plan view showing the transfer carrier for the flexible printed circuit board according to the embodiment of the invention.

The embodiment of the invention will be explained with reference to the accompanying drawings. FIG. 1 is diagrams showing the configuration of a flexible printed circuit board having been mounted according to the embodiment of the invention. FIG. 2 is a plan view showing a transfer carrier for the flexible printed circuit board according to the embodiment of the invention. FIG. 3 is a perspective view showing the transfer carrier and an attachment jig for the flexible printed circuit board according to the embodiment of the invention. FIG. 4 is a diagram for explaining the attachment method of the flexible printed circuit board according to the embodiment of the invention. FIG. 5 is a perspective view showing the transfer carrier for the flexible printed circuit board according to the embodiment of the invention. FIG. 6 is a plan view showing the attachment jig for the flexible printed circuit board according to the embodiment of the invention. FIG. 8 is diagrams for explaining an adhesive supplying process to the flexible printed circuit board according to the embodiment of the invention. FIG. 9(a) is a sectional view of an electronic parts bonding apparatus with respect to the flexible printed circuit board according to the embodiment of the invention and FIG. 9(b) is a diagram for explaining an electronic parts bonding operation on the flexible printed circuit board according to the embodiment of the invention. FIG. 10 is a diagram showing the configuration of a soldering line for the flexible printed circuit board according to the embodiment of the invention. FIG. 11 is diagrams for explaining a solder printing operation to the flexible printed circuit board according to the embodiment of the invention. FIG. 12 is diagrams for explaining an electronic parts mounting operation on the flexible printed circuit board according to the embodiment of the invention. FIG. 13 is a sectional diagram showing the flexible printed circuit board after there flow soldering according to the embodiment of the invention. FIG. 14 is a perspective view showing the transfer carrier for the flexible printed circuit board according to the embodiment of the invention. FIGS. 15 and 16 are plan views of the transfer carrier for the flexible printed circuit board according to the embodiment of the invention.

First, the explanation will be made with reference to FIG. 1 as to a flexible printed circuit board 1 (hereinafter merely referred to as the board 1) and a mounting state of electronic parts mounted on the board 1. The board 1 is a thin and flexible small-sized board which base is formed by a resin film etc. A plurality of small parts 7 such as a semiconductor device 5, resistors, capacitors are mounted on the board 1 as shown in FIG. 1(a). The mounting procedure of these parts are performed in a state where a plurality of the boards 1 are held on a single transfer carrier, so that each of the boards 1 is provided with reference holes 1a for positioning the board 1 to the transfer carrier.

FIG. 1(b) shows a sectional diagram of the board 1 cut along a line A—A. The board 1 is configured in a manner that a circuit pattern 3 is formed on a resin film 2 and an insulation layer 4 covers on the circuit pattern. On the upper surface of the board 1, a bonding portion 1b and solder coupling portions 1c are formed at each of which the insulation layer 4 is not formed and the circuit pattern 3 is exposed. The semiconductor device 5 is mounted on the bonding portion 1b through the bonding in a manner that a bump 5a formed at the lower surface of the semiconductor device 5 is bonding with the circuit pattern 3. The small parts 7 are mounted on the solder coupling portions 1c through the soldering. The terminals of the small parts 7 are coupled to the circuit pattern 3 through fillet shaped solders 8. External coupling terminals 3a, 3b, on the upper surface of each of which the circuit pattern 3 is exposed, are provided at the both end portions of the board 1, respectively.

Next, the explanation will be made with reference to FIG. 2 as to a transfer carrier 10 (hereinafter merely called as a carrier 10) for flexible printed circuit boards which holds the boards 1 in a state that these boards are adhered on the upper surface of the carrier. The carrier 10 is configured in a manner that a resin layer 12 having a smooth surface is formed on the upper surface of a base plate 11 fabricated by material with rigidity such as glass epoxy or a metal plate, as an adhering surface for holding the boards 1 in an adhered state (see FIG. 3). The resin layer 12 is formed by resin of silicon group with electric conductivity and fabricated by hardening liquid resin on the upper surface of the base plate 11. Thus, none of an air layer or an air bubble is formed between the base plate and the resin layer.

In a state where the board 1 is attached to the carrier 10, the lower surface of the board 1 adheres on the smooth surface of the resin layer 12 of the carrier 10. Thus, the board 1 can be held on the carrier 10 without using an adhering means such as an adhesive tape. The resin layer 12 has heat resistivity since it is formed by the resin of silicon group. Further, since none of an air layer or an air bubble is formed between the base plate and the resin layer, the carrier 10 can be used as the transfer carrier for the boards 1 in the reflow process, as described later. Furthermore, since the electronically conductive resin is used as the resin layer 12, the board 1 can be prevented from being electrically charged by static electricity and so various kinds of problems due to static electricity can be prevented from occurring.

As shown in FIG. 2, plural kinds of opening portions with different shapes are provided at the base plate 11 of the carrier 10. First, a circular-shaped positioning hole 10a and an elongated-shaped positioning hole 10b are provided at the both end portions in the longitudinal direction of one of longitudinal sides of the base plate, respectively. These positioning holes serve to position the carrier 10 with respect to an attachment jig described later.

At the portion of the carrier 10 corresponding to the bonding portion 1b of each of the boards 1 held in a parallel state on the carrier, a back-up opening portion 10e is provided through which a back-up portion 22 (see FIG. 7) for receiving a pressing force at the time of bonding the semiconductor device 5 penetrates. A pair of reference pin opening portions 10c are provided at portions sandwiching each of the back-up opening portions 10e from the both sides thereof. Reference pins 15 (see FIG. 3) are inserted into the reference pin opening portions 10c and also inserted into the reference holes 1a of the board 1 thereby to position the bonding portion 1b of each of the boards 1 with respect to the corresponding one of the back-up opening portions 10e. Further, an exfoliation hole 10d is provided at a position corresponding to one corner portion of each of the boards 1. The exfoliation hole 10d is an opening in which an exfoliation tool is inserted at the time of detaching the board 1 held on the carrier 10 in an adhesive manner, as described later.

The exfoliation holes 10d are not necessarily required and the board 1 can be detached by sticking a pin etc. from the lower side of the board through the potion 10e or the reference pin opening portion 10c. However, the board 1 can be detached more easily by providing the exfoliation holes 10d dedicated for the exfoliation.

Next, the explanation will be made as to the electronic part mounting method for mounting the electronic parts on the board 1 held on the carrier 10. According to this electronic part mounting method, the boards 1 are held on the carrier 10, then the semiconductor devices 5 are bonded on the bonding portions 1b of these boards 1 and the small parts 7 are mounted on the solder coupling portions 1c through the soldering.

First, the mounting method of the boards 1 on the carrier 10 will be explained with reference to FIGS. 3, 4 and 5. The board 1 can be attached to the carrier 10 by using an attachment jig 13 shown in FIG. 3. On the upper surface of the attachment jig 13, positioning pins 14 for positioning the carrier 10 are provided in correspondence with the positions of the positioning holes 10*a* and 10*b* of the carrier 10, respectively. Further, on the upper surface of the attachment jig, the reference pins 15 which fit into the reference holes 1*a* of the board 1 to position the boards 1 are provided so as to erect from the attachment jig in corresponding with the attachment positions of the boards 1 on the carrier 10, respectively.

The carrier 10 can be set to the attachment jig 13 by positioning the positioning pins 14 to the positioning holes 10*a* and 10*b* and penetrating therethrough. Thus, as shown in FIG. 4, the reference pins 15 pass through the corresponding reference pin opening portions 10*c* and protrude from the upper surface of the carrier 10, respectively, whereby the reference pins 15 are relatively positioned with respect to the reference pin opening portions 10*c*.

In this configuration, the positioning holes 10*a* and 10*b* serve as reference portions to which the positioning pins 14 contact that serve as reference members for relatively positioning the reference pin opening portions 10*c* and the reference pins 15. That is, in this case, in a state where the reference pins 15 to be inserted into the reference holes 1*a* of the boards 1 are passed through the reference pin opening portions 10*c*, the positioning holes 10*a* and 10*b* (the reference portions) are made in contact with the positioning pins 14 (the reference members) thereby to relatively position the reference pin opening portions 10*c* and the reference pins 15.

Then, as shown in FIG. 4, the boards 1 can be attached to the carrier 10 in a manner that the reference pins 15 are inserted into the reference holes 1*a* of the boards 1 and then the lower surfaces of the boards 1 are pushed against and adhered to the smooth surface of the resin layer 12 disposed on the upper surface of the carrier 10. Thus, the boards 1 are positioned at the predetermined positions of the carrier 10 and held in a state of being adhered to the resin layer 12. In other words, in this case, the reference pins 15 are inserted into the reference holes 1a of the boards 1 thereby to position the boards 1, and in such a state the lower surfaces of the boards 1 are adhered to the resin layer 12.

Thereafter, as shown in FIG. 5, the carrier 10 holding the boards 1 thereon is detached from the attachment jig 13, whereby the attachment of the boards 1 to the carrier 10 is completed. In other words, the reference pins 15 are removed from the reference holes 1*a* and also the contact state between the positioning holes 10*a* and 10*b* (the reference portions) and the positioning pins 14 (the reference members) is withdrawn. In this state, the carrier 10 holding the boards 1 in the positioning state can be treated as a single rigid board, so that all procedures for mounting the semiconductor devices 5 and the small parts 7 on the boards 1 can be performed in a state that all the boards 1 are held on the same carrier 10.

In place of the aforesaid attachment jig for positioning the carrier 10 using the positioning pins 14, an attachment jig 13A may be employed which is provided with positioning members 16 contacting with the side surfaces 10*g* and 10*f* in the two directions of the carrier 10. In this configuration, the positioning members 16 serve as the reference members for relatively positioning the reference pin opening portions 10*c* and the reference pins 15. The side surfaces 10*g* and 10*f* of the base plate 11 (see FIG. 3) of the carrier 10 serve as the reference portions to which the reference members contact, and the side surfaces of the positioning members 16 serve as positioning reference surfaces contacting with the side surfaces 10*g* and 10*f*.

Figure 7:
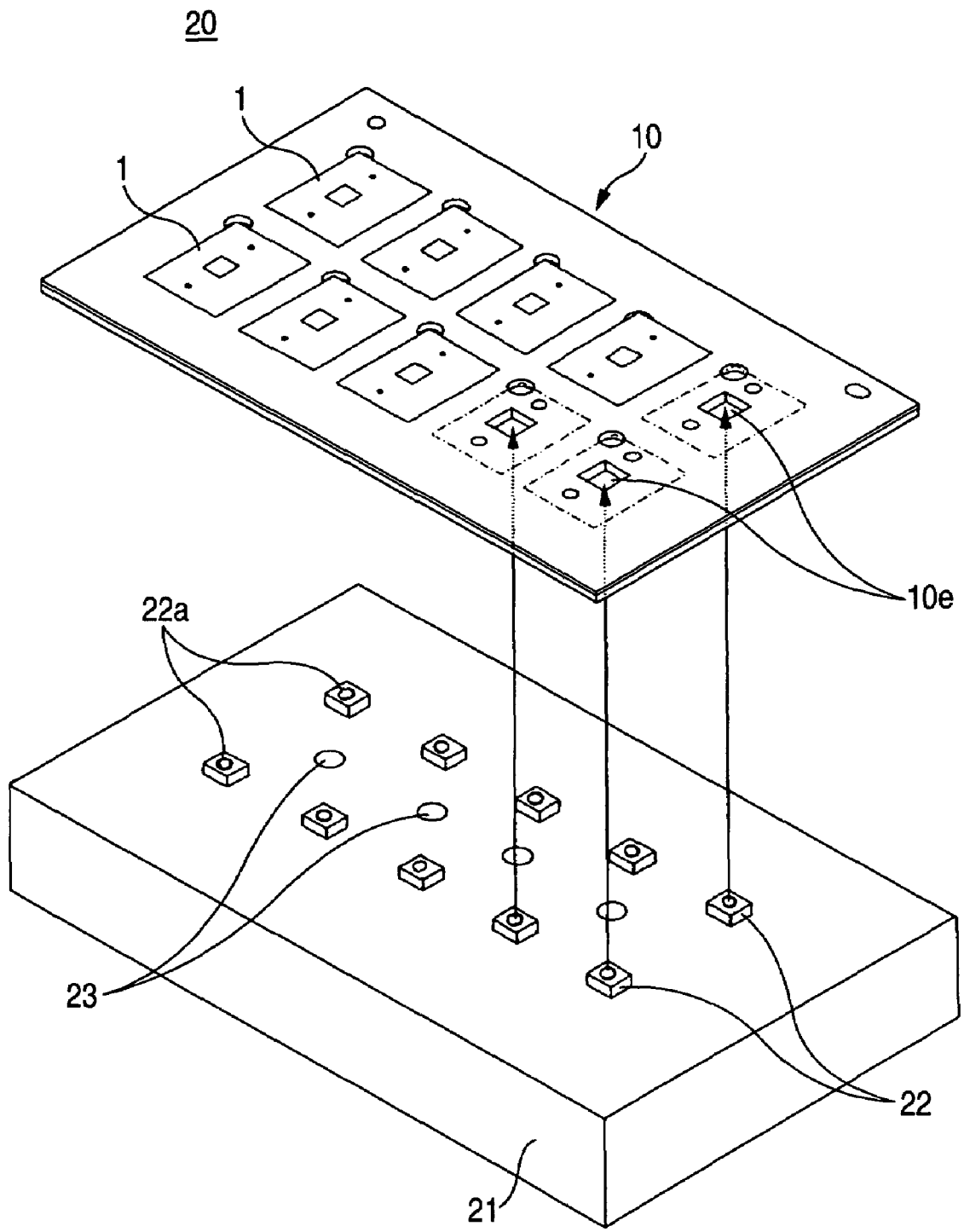
FIG. 7 is a perspective view showing a part of an adhesive supply apparatus for the flexible printed circuit board according to the embodiment of the invention.

Next, the supply of the adhesive to the boards 1 will be explained with reference to FIGS. 7 and 8. FIG. 7 shows an adhesive supply apparatus 20, in which the carrier 10 holding the boards 1 thereon is attached to a carrier holding table 21. The back-up portions 22 and first suction holes 23 are provided at the upper surface of the carrier holding table 21 and further second suction holes 22*a* are provided on the upper surface of the back-up portions 22.

The adhesive is supplied through the transferring. As shown in FIG. 8(*a*), the carrier 10 is positionally aligned with the carrier holding table 21 and attached thereto. Then, as shown in FIG. 8(*b*), the carrier 10 is absorbed and held by means of the first suction holes 23 and also the back-up portions 22 are inserted from the lower direction into the back-up opening portions 10*e* provided at the carrier 10, and air is sucked through the second suction holes 22*a* thereby to fix the boards 1.

Next, as shown in FIG. 8(*c*), adhesive 24 such as a tape shaped an isotropic conductive material (ACF) formed with a predetermined size on a separator tape 25 is transferred on the bonding portion 1*b* (see FIG. 1) of the board 1 by pushing a pasting tool 26 from the upper direction of the separator tape 25. The pushing force at the time of the transferring operation is supported by the back-up portion 22. Then, as shown in FIG. 8(*d*), the carrier 10 is detached from the carrier holding table 21, whereby the adhesive supply is completed. Incidentally, in place of using the adhesive formed in advance in the tape shape on the separator tape, adhesive in a past state may be coated by means of a dispenser etc. In this case, the back-up portions 22 may be eliminated.

Next, the bonding operation of the semiconductor devices 5 will be explained with reference to FIG. 9. FIG. 9(*a*) shows the configuration of an electronic part bonding apparatus 30. The carrier 10 holding the boards 1 to which the adhesive 24 was supplied is placed on a carrier holding table 32 and sucked by a suction hole 33 through the vacuum sucking thereby to be held on the table. The carrier holding table 32 can move in the X, Y and θ directions by an XY θ table 31. A control portion 38 controls the XY θ table 31 thereby to adjust the position of the carrier 10.

The side direction of the XY θ table 31 is defined as abounding position B. A back-up portion 35 is disposed at the bonding position B so as to elevate freely by a back-up elevation portion 35*a*. The back-up portion 35 abuts against the lower surface of the board 1 at the time of bonding the semiconductor device 5 by a bonding head 34 thereby to support a bonding load from the lower direction.

A board image pickup camera 39 is disposed above the carrier holding table 32. The board image pickup camera 39 picks up an image of reference marks and the reference holes on the board 1 held on the carrier 10. The picked-up image is subjected to a recognition processing by a recognition portion 37, whereby the position of the bonding portion 1*b* of the board 1 is recognized and the recognition result is sent to the control portion 38. A semiconductor device image pickup camera 36 is disposed beneath the bonding head 34. The semiconductor device image pickup camera 36 picks up an image of the semiconductor device 5 held by the bonding head 34. The picked-up image is subjected to the recognition processing by the recognition portion 37, whereby the position of the bump 5a of the semiconductor device 5 is recognized and the recognition result is sent to the control portion 38.

FIG. 9(b) shows the bonding operation of the electronic parts. In this bonding operation, the XY θ table 31 is driven thereby to move the bonding portion 1b of the board 1 as a subject to the bonding position Band also position the bonding head 34 holding the semiconductor device 5 above the bonding position B. In this case, the control portion 38 controls the XY θ table 31 based on the recognition result of the board 1 and the recognition result of the bump 5a of the semiconductor device 5. Thus, the bump 5a is positioned to the circuit pattern 3 of the bonding portion 1b.

Next, the bonding portion is received from the lower side. That is, the back-up portion 35 of the bonding apparatus is inserted into the back-up opening portion 10e formed at the position corresponding to the bonding portion 1b of the board 1 thereby to support the bonding portion 1b from the lower direction thereof. Then, the semiconductor device 5 is bonded by the bonding head 34 on the bonding portion 1b supported by the back-up portion 35.

Next, the mounting procedure of the small parts on the board 1 through the soldering will be explained with reference to FIGS. 10 to 13. FIG. 10 shows the configuration of a soldering line 40 used in the mounting procedure. The soldering line 40 is configured by a solder supply apparatus 41, an electronic part mounting apparatus 42 and a reflow apparatus 43.

FIG. 11 shows a solder printing operation on the board 1 performed by the solder supply apparatus 41. In FIG. 11(a), the carrier 10 holding the board 1 on which the semiconductor device 5 was bonded is placed on a printing table 41a. A screen mask 44, provided with solder supply openings 44a corresponding to the solder supply portions of the solder coupling portions 1c, is attached on the carrier 10. A recess portion 44b is provided at a position of the screen mask 44 corresponding to the bonding portion 1b so that the semiconductor device 5 does not interfere with the screen mask 44 at the time of attaching the screen mask 44.

After attaching the screen mask, cream solder 46 is supplied on the upper surface of the screen mask 44. As shown in FIG. 11(b), when such a squeegeeing process that a squeegee 45 is slid on the screen mask 44 is performed, the cream solder 46 is filled within the solder supply openings 44a. Then, when the screen mask 44 is detached from the carrier 10, as shown in FIG. 11(c), the cream solder 46 is supplied to the circuit pattern 3 (the electrodes) of the solder coupling portions 1c of the board 1 on which the semiconductor device 5 has been bonded in the previous process.

Next, the electronic parts mounting operation will be explained with reference to FIG. 12. In FIG. 12(a), the carrier 10 holding the board 1 having been supplied with the solder is supported by support pins 47 erected on a supporting table 42a. Next, as shown in FIG. 12(b), the small part 7 is held by the holding nozzle 48 of a mounting head and the holding nozzle is lowered with respect to the board 1. Thus, as shown in FIG. 12(c), the small part 7 contacts on the cream solder 46 and so the small part 7 is mounted on the board 1 on which the semiconductor device 5 has been bonded in the previous process.

Thereafter, the carrier 10 holding the boards 1 on which the small parts 7 are mounted is transferred into and heated by the heating furnace of there flow apparatus 43. Then, the cream solder 46 is melted and, as shown in FIG. 13, each of the small parts is soldered by the fillet-shaped solder 8 on the circuit pattern 3 (see FIG. 1) of the solder coupling portion 1c of the board 1.

Thereafter, the carrier 10 transferred out of the reflow apparatus 43 is cooled. Then, the board 1 on which the semiconductor device 5 is bonded and the small parts 7 are soldered is removed. That is, as shown in FIG. 14, the tip end of an exfoliation tool 49 is inserted into the exfoliation hole 10d thereby to exfoliate the end portion of the board 1 from the surface of the resin layer 12 of the carrier 10 and then exfoliate the entire surface of the board 1 and takes out the board.

As explained above, in the mounting method of the electronic parts on the board 1 shown in this embodiment, the board 1 can be rigidly held on the carrier without being positionally deviated by merely forming the resin layer 12, which has the smooth surface adhered to the lower surface of the board 1, on the upper surface of the carrier 10 and by pushing the board 1 against the carrier 10. Thus, this embodiment does not require the adhesive tape for fixing the board which is used in the conventional carrier for a flexible printed circuit board and deteriorated in heat resistance. Thus, the same carrier 10 can also be used in the reflow process.

Then, at the time of setting the board 1 to the carrier 10, the reference pins 15 are inserted into the reference holes 1a of the board 1, whereby the relative position of the board 1 with respect to the carrier 10 can be correctly secured. Thus, the correct mounting accuracy without any positional deviation can be secured also at the time of bonding the semiconductor device 5 and mounting the small parts 7.

Accordingly, the mounting procedures of the electronic parts including the bonding of the semiconductor device 5 and the soldering of the small parts 7 can be performed by the same carrier 10. Thus, the exchanging procedure required conventionally, that is, such a procedure is not required that the flexible printed circuit board after subjecting to the bonding of the semiconductor device is removed from the bonding carrier, then the bonding carrier is replace by a carrier for soldering and the board is placed on the carrier for soldering. Thus, the same transfer carrier can cope with the different mounting methods.

FIGS. 15 and 16 show an example in which the shapes of the opening portions of the carrier 10 shown in FIG. 2 are modified. First, a carrier 10A shown in FIG. 15 is arranged in a manner that the exfoliation holes 10d of the carrier 10 shown in FIG. 2 are eliminated and one of the two reference pin opening portions 10c of each of the board is formed as an elongated hole 10h which extrudes outside from the outer periphery of the board 1. Thus, the single elongated hole 10h can serve as both the exfoliation hole and the reference pin opening portion, and so the number of processing at the time of manufacturing the carrier can be reduced.

A carrier 10B shown in FIG. 16 is arranged in a manner that the back-up opening portion 10e and the reference pin opening portion 10c of the carrier 10 shown in FIG. 2 are formed as a continuous single opening 10i. That is, in this example, the opening portion 10i is opened at a portion corresponding to the bonding portion 1b of the board 1. The opening portion 10i serves as an opening portion through which the back-up portion 22 for receiving the pressing force at the time of bonding the semiconductor device 5 passes and also through which the pin 15 for being inserted into the reference hole 1a of the board 1 to position the bonding portion 1b of the board 1 passes. At the time of attaching the board 1 to the carrier 10B, in a state that the reference pins 15 to be inserted into the reference holes 1a of the board 1 are passed through the opening portions 10i, the positioning pins 14 are fit into the positioning holes 10a and 10b thereby to relatively position the opening portions 10i and the reference pins 15.

As described above, according to the invention, opening portions through which the back-up portions for bonding the semiconductor devices and the reference pins for positioning the flexible printed circuit board are passed are provided at the base plate on which a resin layer having a smooth surface to be adhered to the lower surface of the flexible printed circuit board is formed. Further, the reference portions to which the reference members for relatively positioning the opening portions and the reference pins contact are provided at the base plate. Thus, the flexible printed circuit boards can be held adhesively on the carrier in a state that the boards are positioned, whereby the same transfer carrier can cope with the different mounting methods.

What is claimed is:

1. In a method of mounting electronic parts on a flexible printed circuit board in which a plurality of flexible printed circuit boards are held on a transfer carrier for the flexible printed circuit boards which is formed by a base plate and a resin layer formed on an upper surface of the base plate, and semiconductor devices are bonded on bonding portions of the flexible printed circuit boards, the method comprising the steps of:

contacting reference portions of the base plate with reference members thereby to relatively position reference pin opening portions opened at the base plate and reference pins to be respectively inserted into reference holes of the flexible printed circuit boards in a contact state where the reference pins are respectively penetrated through the reference pin opening portions;

inserting the reference pins into the reference holes of the flexible printed circuit boards to position the flexible printed circuit boards, respectively, and contacting adhesively lower surfaces of the flexible printed circuit boards to the resin layer in the contact state;

withdrawing the reference pins from the reference holes and releasing the contact state between the reference portions and the reference members;

inserting a back-up portion of a bonding apparatus into a back-up opening potion which is formed at a position of the transfer carrier corresponding to the bonding portion of the flexible printed circuit board thereby to support the bonding portion from a lower direction; and bonding a semiconductor device on the bonding portion supported by the back-up portion.

2. In a method of mounting electronic parts on a flexible printed circuit board in which a plurality of flexible printed circuit boards are held on a transfer carrier for the flexible printed circuit boards which is formed by a base plate and a resin layer formed on an upper surface of the base plate, semiconductor devices are bonded on bonding portions of the flexible printed circuit boards, and small parts are soldered on solder coupling portions, the method comprising the steps of:

contacting reference portions of the base plate with reference members thereby to relatively position reference pin opening portions opened at the base plate and reference pins to be respectively inserted into reference holes of the flexible printed circuit boards in a contact state where the reference pins are respectively penetrated through the reference pin opening portions;

inserting the reference pins into the reference holes of the flexible printed circuit boards to position the flexible printed circuit boards, respectively, and contacting adhesively lower surfaces of the flexible printed circuit boards to the resin layer in the contact state;

withdrawing the reference pins from the reference holes and releasing the contact state between the reference portions and the reference members;

inserting a back-up portion of a bonding apparatus into a back-up opening potion which is formed at a position of the transfer carrier corresponding to the bonding portion of the flexible printed circuit board thereby to support the bonding portion from a lower direction;

bonding a semiconductor device on the bonding portion supported by the back-up portion;

supplying solder to electrodes of the solder coupling portions of the flexible printed circuit boards on which the semiconductor devices are bonded;

contacting the small parts to the solder thereby to mount the small parts on the flexible printed circuit boards on which the semiconductor devices are bonded;

transferring into a heating furnace and heating a transfer carrier for the flexible printed circuit boards which holds the flexible printed circuit boards on which the small parts are mounted thereby to melt the solder to solder the small parts; and taking out the flexible printed circuit boards on which the semiconductor devices are bonded and the small parts are soldered from the resin layer of the transfer carrier.

3. In a method of mounting electronic parts on a flexible printed circuit board in which a plurality of flexible printed circuit boards are held on a transfer carrier for the flexible printed circuit boards which is formed by a base plate and a resin layer formed on an upper surface of the base plate, and semiconductor devices are bonded on bonding portions of the flexible printed circuit boards, the method comprising the steps of:

contacting reference portions of the base plate with reference members thereby to relatively position reference pin opening portions opened at the base plate and reference pins to be respectively inserted into reference holes of the flexible printed circuit boards in a contact state where the reference pins are respectively penetrated through the reference pin opening portions;

inserting the reference pins into the reference holes of the flexible printed circuit boards to position the flexible printed circuit boards, respectively, and contacting adhesively lower surfaces of the flexible printed circuit boards to the resin layer in the contact state;

withdrawing the reference pins from the reference holes and releasing the contact state between the reference portions and the reference members;

inserting a back-up portion of a bonding apparatus at a position of the opening portions corresponding to the bonding portion of the flexible printed circuit board thereby to support the bonding portion from a lower direction; and bonding a semiconductor device on the bonding portion supported by the back-up portion.

4. In a method of mounting electronic parts on a flexible printed circuit board in which a plurality of flexible printed circuit boards are held on a transfer carrier for the flexible printed circuit boards which is formed by a base plate and a resin layer formed on an upper surface of the base plate, semiconductor devices are bonded on bonding portions of the flexible printed circuit boards, and small parts are soldered on solder coupling portions, the method comprising the steps of:

contacting reference portions of the base plate with reference members thereby to relatively position opening portions opened at the base plate and reference pins to be respectively inserted into reference holes of the flexible printed circuit boards in a contact state where the reference pins are respectively penetrated through the opening portions;

inserting the reference pins into the reference holes of the flexible printed circuit boards to position the flexible printed circuit boards, respectively, and contacting adhesively lower surfaces of the flexible printed circuit boards to the resin layer in the contact state;

withdrawing the reference pins from the reference holes and releasing the contact state between the reference portions and the reference members;

inserting a back-up portion of a bonding apparatus at a position of the opening portions corresponding to the bonding portion of the flexible printed circuit board thereby to support the bonding portion from a lower direction;

bonding a semiconductor device on the bonding portion supported by the back-up portion;

supplying solder to electrodes of the solder coupling portions of the flexible printed circuit boards on which the semiconductor devices are bonded;

contacting the small parts to the solder thereby to mount the small parts on the flexible printed circuit boards on which the semiconductor devices are bonded;

transferring into a heating furnace and heating a transfer carrier for the flexible printed circuit boards which holds the flexible printed circuit boards on which the small parts are mounted thereby to melt the solder to solder the small parts; and taking out the flexible printed circuit boards on which the semiconductor devices are bonded and the small parts are soldered from the resin layer of the transfer carrier.

* * * * *